(12) United States Patent
Chen et al.

(10) Patent No.: US 7,829,403 B2
(45) Date of Patent: Nov. 9, 2010

(54) METHOD FOR FABRICATING SEMICONDUCTOR DEVICE

(75) Inventors: Wen-Hsiang Chen, Taoyuan (TW); Cheng-Yeh Hsu, Taoyuan (TW)

(73) Assignee: Inotera Memories, Inc., Taoyuan (TW)

( * ) Notice: Subject to any disclaimer, the term of this patent is extended or adjusted under 35 U.S.C. 154(b) by 235 days.

(21) Appl. No.: 12/139,426

(22) Filed: Jun. 13, 2008

(65) Prior Publication Data

US 2009/0137090 A1 May 28, 2009

(30) Foreign Application Priority Data

Nov. 23, 2007 (TW) .............................. 96144513 A

(51) Int. Cl.
*H01L 21/8238* (2006.01)
(52) U.S. Cl. ................ 438/199; 438/283; 257/E21.177
(58) Field of Classification Search ................ 438/199, 438/197, 275, 283, 592; 257/E21.177
See application file for complete search history.

(56) References Cited

U.S. PATENT DOCUMENTS

| 6,372,590 | B1* | 4/2002 | Nayak et al. ................. 438/305 |
| 2006/0160290 | A1* | 7/2006 | Chong et al. ................. 438/199 |
| 2007/0059874 | A1* | 3/2007 | Moumen et al. ............. 438/199 |
| 2007/0164366 | A1* | 7/2007 | Wu et al. ..................... 257/369 |
| 2008/0017930 | A1* | 1/2008 | Kim et al. .................... 257/369 |

* cited by examiner

*Primary Examiner*—Chandra Chaudhari
*Assistant Examiner*—Julia Slutsker

(57) ABSTRACT

A method for fabricating a semiconductor device is provided. A first active region and a second active region are defined in a substrate. An electrode covering the first active region and the second active region is formed on the substrate. A first sacrificial layer is formed on the second active layer. A first work function electrode is formed on the first active layer by performing a first doping process to a portion of the electrode. The first sacrificial layer is removed. A second sacrificial layer is formed on the first active layer.

25 Claims, 5 Drawing Sheets

METHOD FOR FABRICATING SEMICONDUCTOR DEVICE

CROSS REFERENCE TO RELATED APPLICATIONS

This Application claims priority of Taiwan Patent Application No. 096144513, filed on Nov. 23, 2007, the entirety of which is incorporated by reference herein.

BACKGROUND OF THE INVENTION

1. Field of the Invention

The present invention relates to a method for fabricating a semiconductor device, and in particular relates a method for fabricating a semiconductor device having dual-work function electrodes.

2. Description of the Related Art

Continuing advances in semiconductor manufacturing processes have resulted in semiconductor devices with precision features and/or higher degrees of integration. For deep submicron technology, when the effective gate length of a MOS device decreases, leakage increases. Cause-and-effect examples of scaling trends include: (1) Reducing threshold voltage results in exponentially increasing sub-threshold leakage; (2) Gate edge direct tunneling results in tunneling leakage; (3) Reducing gate oxide thickness results in exponentially increasing gate-induced drain-leakage; and (4) Increasing lightly doped-drain (LDD) or pocket-doping concentration results in exponentially increasing bulk band-to-band-tunneling leakage. Thus, it is pertinent that leakage is precisely controlled without reducing voltage, following physical scaling of the MOS device. In addition, it is pertinent that the size of the device, such as thickness, and especially bottom thickness, of the gate structure is precisely controlled since the size of the device may dictate the channel length and the boundary of the source/drain.

A dual-work function gate MOS device comprises gate structures having different work functions. The dual-work function gate MOS device may usually comprise a gate oxide layer formed on a reactive region in a substrate. A polysilicon electrode may be formed on the gate oxide layer. Doping processes may be performed to the polysilicon electrode to form polysilicon electrodes having different work functions. Metal electrodes may be formed on the polysilicon electrodes. Top portions of the polysilicon electrodes and the metal electrodes may be patterned. Hard mask layers may be formed on sides and top surfaces of the patterned top portions of the polysilicon electrodes and metal electrodes to protect the patterned metal electrodes. The polysilicon electrode is doped with different dopants. Meanwhile, the work function and an etching rate of the polysilicon electrode may be different. The etching rate of the N-type doped polysilicon electrode may be faster than that of the P-type doped polysilicon electrode. Because the hard mask layers may be used to protect the patterned top portions of the polysilicon electrodes and metal electrodes, an etching process may be performed to remove bottom portions of the polysilicon electrodes. In one example, the bottom portion of the N-type doped polysilicon electrode may be etched to a desired width and the bottom portion of the P-type doped polysilicon electrode may be etched to a width bigger than the desired width. In another example, the bottom portion of the P-type doped polysilicon electrode may be etched to a desired width and the bottom portion of the N-type doped polysilicon electrode may be etched to a width smaller than the desired width. As a result, the polysilicon electrodes may be etched with undesired widths.

As described above, a method for fabricating a semiconductor device with dual-work function electrodes having desired widths is needed.

BRIEF SUMMARY OF INVENTION

A detailed description is given in the following embodiments with reference to the accompanying drawings.

The invention provides a method for fabricating a semiconductor device. An embodiment of a method for fabricating a semiconductor device comprises: providing a substrate; defining a first active region and a second active region in the substrate; forming an electrode on the substrate, covering the first active region and the second active region; forming a first sacrificial layer on the second active layer, and performing a first doping process to a portion of the electrode to form a first work function electrode on the first active layer; removing the first sacrificial layer, and forming a second sacrificial layer on the first active layer, and performing a second doping process to a portion of the electrode to form a second work function electrode on the second active layer; removing the second sacrificial layer, and etching a portion of the first work function electrode and the second work function electrode to form a patterned first work function electrode with a first bulge portion and a patterned second work function electrode with a second bulge portion; forming a hard mask layer covering the first bulge portion and the second bulge portion; forming a third sacrificial layer on the second active region, covering the patterned second work function electrode; removing a portion of the patterned first work function electrode to leave the first bulge portion under the hard mask layer to be a first work function gate structure; removing the third sacrificial layer, and forming a fourth sacrificial layer on the first active region, covering the patterned first work function electrode; removing a portion of the patterned second work function electrode to leave the second bulge portion under the hard mask layer to be a second work function gate structure; and removing the fourth sacrificial layer.

Another embodiment of a method for fabricating a semiconductor device comprises: providing a substrate; defining a first active region and a second active region in the substrate; forming an electrode on the substrate, covering the first active region and the second active region; forming a first sacrificial layer on the second active layer using a first mask, and performing a first doping process to a portion of the electrode for forming a first work function electrode on the first active layer; removing the first sacrificial layer, and forming a second sacrificial layer on the first active layer using a second mask, and performing a second doping process to a portion of the electrode for forming a second work function electrode on the second active layer; removing the second sacrificial layer, and etching a portion of the first work function electrode and the second work function electrode for forming a patterned first work function electrode with a first bulge portion and a patterned second work function electrode with a second bulge portion; forming a hard mask layer covering the first bulge portion and the second bulge portion; forming a third sacrificial layer on the second active region using the first mask, covering the patterned second work function electrode; removing a portion of the patterned first work function electrode to leave the first bulge portion under the hard mask layer to be a first work function gate structure; removing the third sacrificial layer, and forming a fourth sacrificial layer on the first active region using the second mask, covering the patterned first work function electrode; removing a portion of the patterned second work function electrode to leave the second bulge portion under the hard mask layer to be a second work function gate structure; and removing the fourth sacrificial layer.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

Figure 1:
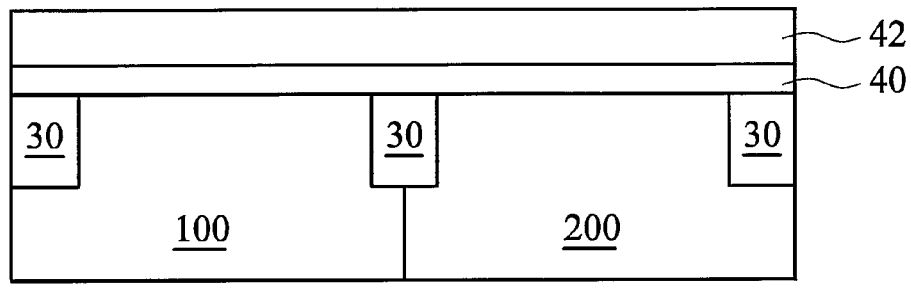
FIGS. 1 to 9 are cross-section views illustrating a preferred embodiment of a method for fabricating a gate structure.

The following description is of the best-contemplated mode of carrying out the invention. This description is made for the purpose of illustrating the general principles of the invention and should not be taken in a limiting sense. The scope of the invention is best determined by reference to the appended claims.

Embodiments of the present invention provide a method for forming a semiconductor device. References will be made in detail to the present embodiments, examples of which are illustrated in the accompanying drawings. Wherever possible, the same reference numbers are used in the drawings and the descriptions to refer to the same or like parts. In the drawings, the shape and thickness of one embodiment may be exaggerated for clarity and convenience. The descriptions will be directed in particular to elements forming a part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

FIGS. 1 to 9 are cross-section views illustrating a preferred embodiment of the method for fabricating the gate structure. Referring to FIG. 1, a substrate is provided. The substrate may comprise silicon. In alternative embodiments, SiGe, bulk semiconductor, strained semiconductor, compound semiconductor, silicon on insulator (SOI), or other commonly used semiconductor substrates can be used for the substrate. An isolation structure 30 is formed in the substrate, and thus a first active region 100 and a second active region 200 are defined. The isolation structure 30 may be formed by a shallow trench isolation (STI) process comprising steps, such as, etching a trench, filling the trench with a dielectric material by chemical vapor deposition (CVD), and planarizing by chemical mechanical polishing (CMP). In an alternative embodiment, another isolation structure 30, such as field oxide (formed by a local oxidation of silicon (LOCOS) method), may be formed for defining the active regions. In one embodiment, a doping process may be performed to the first active region 100 or the second active region 200 to form an N-type doped region or a P-type doped region, serving as an active charge carrier region of a MOS device.

After defining the first active region 100 and the second active region 200, a first work function gate structure and a second work function gate structure having different work functions are formed in the first active region 100 and the second active region 200 respectively. In one embodiment, the first work function gate structure and/or the second work function gate structure may be a multi-layered structure comprising a dielectric layer at a bottom of the first work function gate structure and/or the second work function gate structure, and a first work function electrode and/or a second work function electrode formed on the dielectric layer. In the preferred embodiment, the first work function gate structure and/or the second work function gate structure further comprises a top electrode on the first work function electrode and/or the second work function electrode. Referring to FIG. 1, the dielectric layer 40 is formed on the first active region 100 and the second active region 200. The dielectric layer 40 can be, for example, $SiO_2$, SiON, SiN, high-k dielectric material or combination thereof. The dielectric layer 40 can also be $Al_2O_3$, $HfO_2$, HfON, $HfSiO_4$, $ZrO_2$, ZrON, $ZrSiO_4$, $Y_2O_3$, $La_2O_3$, $CeO_2$, $TiO_2$, $Ta_2O_5$ or combination thereof. In one embodiment, the dielectric layer 40 may be a silicon oxide layer formed in the substrate by thermal oxidation.

Figure 2:
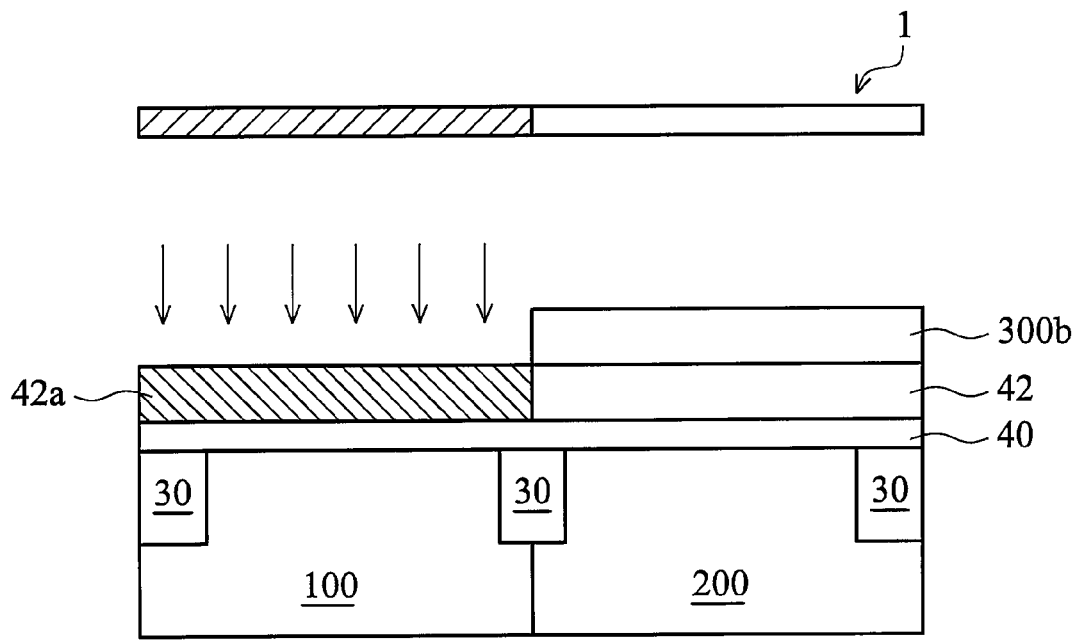
Figure 3:
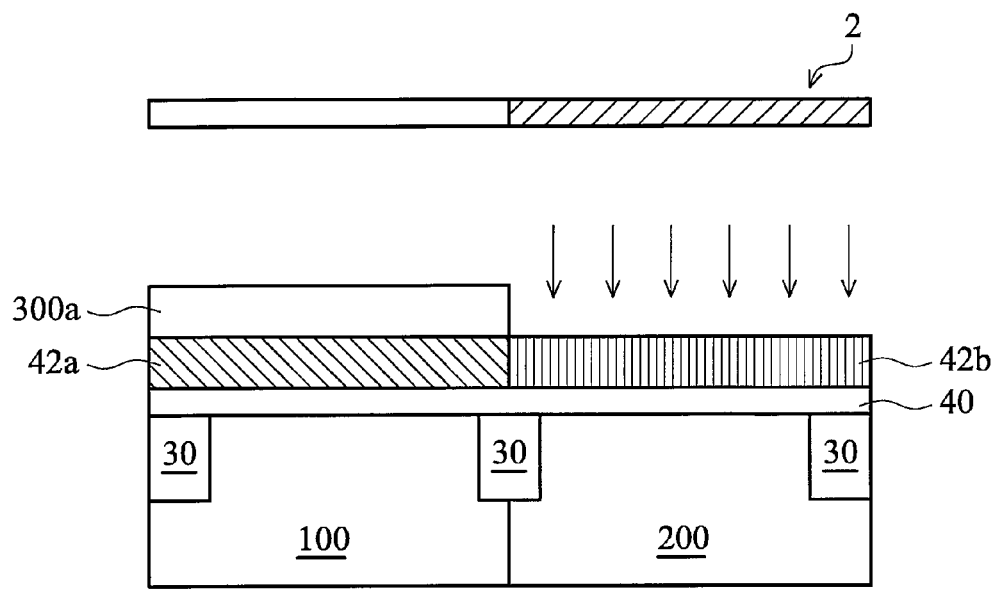

Referring to FIGS. 1 to 3, after forming the dielectric layer 40, an electrode 42 is formed on the dielectric layer 40, covering the first active region 100 and the second active region 200. Next, the first work function electrode 42a having a first work function and the second work function electrode 42b having a second work function are formed by performing a first doping process and a second doping process to the electrode 42 on the first active region 100 and the second active region 200 respectively. The first work function may be different from the second work function. An etching rate of the first work function electrode 42a may be different from that of the second work function electrode 42b. In the preferred embodiment, the electrode 42 may be polysilicon. In other embodiments, the electrode 42 may be a single layer or a composite layer comprising metals (such as molybdenum, tungsten, titanium, tantalum, platinum or hafnium), metal silicides (such as nickel silicide, cobalt silicide, tungsten silicide, titanium silicide, tantalum silicide, platinum silicide or erbium silicide), metal nitrides (such as molybdenum nitride, tungsten nitride, titanium nitride or tantalum nitride), conductive oxide materials (such as ruthenium oxide or indium tin oxide) or combination thereof.

Referring to FIG. 2, a sacrificial layer 300b is formed on the electrode 42 on the second active region 200. The sacrificial layer 300b may be formed by a lithograph process using a first mask 1. The first work function electrode 42a having the first work function can be formed by performing the first doping process to the electrode 42 on the first active region 100. Referring to FIG. 3, the sacrificial layer 300b is removed. A sacrificial layer 300a is formed on the electrode 42 on the first active region 100. The sacrificial layer 300a may be formed by a lithograph method using a first mask 2. The second work function electrode 42b having the second work function can be formed by performing the second doping process to the electrode 42 on the second active region 200. Next, the sacrificial layer 300a is removed. The sacrificial layer 300a and/or 300b may comprise oxide, nitride, oxynitride or commonly used photoresist.

The etching rate in the same etching condition of the electrode 42 may be changed as the electrode 42 is doped with different doping parameters to form the first work function electrode 42a and the second work function electrode 42b having different work functions. The doping parameters, that may influence the work function and the etching rate of the electrode 42, comprise different kinds of doping elements, or doses of doping. Doping elements may comprise, for example, phosphorous, antimony, and/or arsenic of N-type impurities, or boron of P-type impurities. In one embodiment, the first work function electrode 42a may be an N-type doped polysilicon and the second work function electrode 42b may be a P-type doped polysilicon, thus, the etching rate of the first work function electrode 42a is faster than the etching rate of the second work function electrode 42b.

Figure 4:
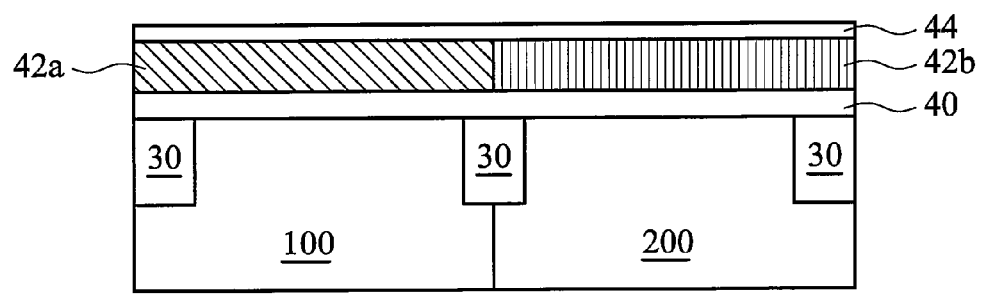

Referring to FIG. 4, the sacrificial layer 300a is removed. After forming the first work function electrode 42a and the second work function electrode 42b having different work functions, the top electrode 44 may be formed on the first work function electrode 42a and the second work function electrode 42b. In one embodiment, the top electrode 44 may be a single layer or a composite layer comprising metals (such as molybdenum, tungsten, titanium, tantalum, platinum or hafnium), metal silicides (such as nickel silicide, cobalt silicide, tungsten silicide, titanium silicide, tantalum silicide, platinum silicide or erbium silicide), metal nitrides (such as molybdenum nitride, tungsten nitride, titanium nitride or tantalum nitride), conductive oxide materials (such as ruthenium oxide or indium tin oxide) or combination thereof. In the preferred embodiment, the electrode 44 may be tungsten.

Figure 5:
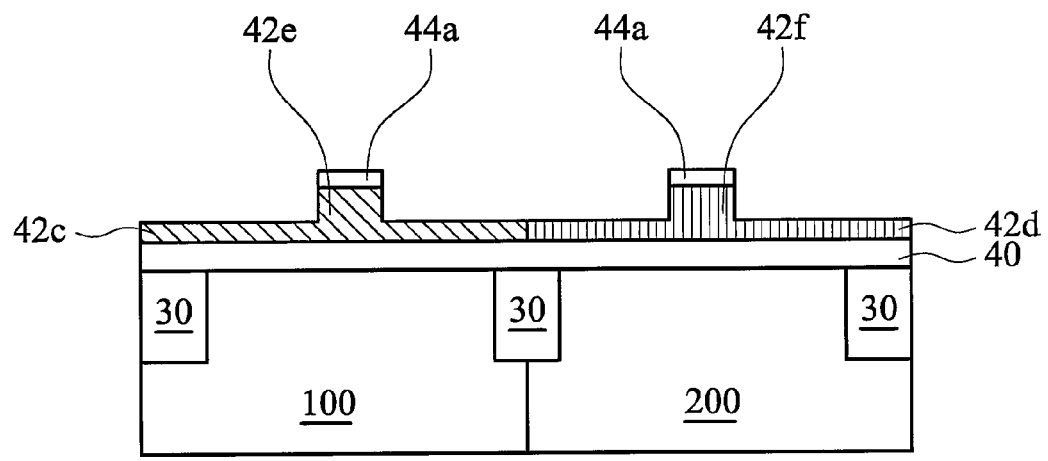
Figure 6:
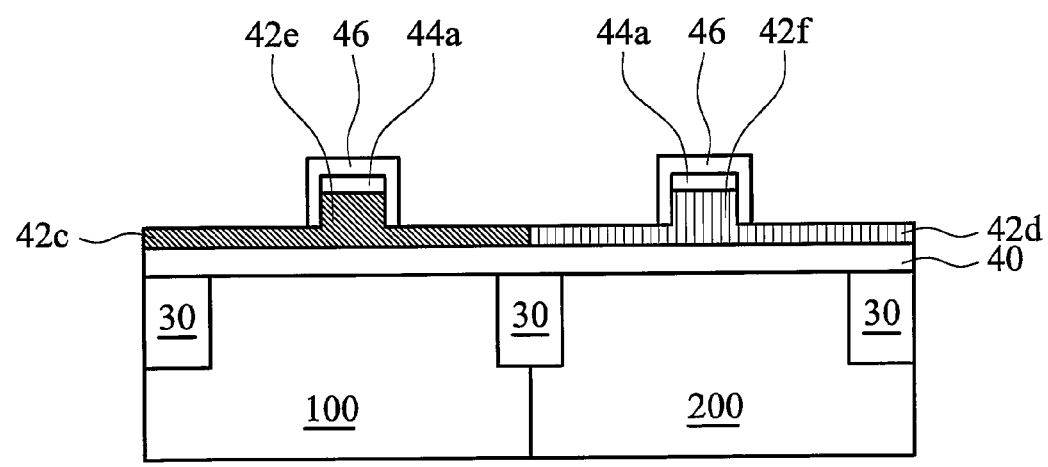

Referring to FIG. 5, a patterned first work function electrode 42c with a first bulge portion 42e and a patterned second work function electrode 42d with a second bulge portion 42f may be formed by performing a lithograph process to removing a portion of the top electrode 44, the first work function electrode 42a and the second work function electrode 42b. Referring to FIG. 6, a hard mask layer 46 may be formed by a lithography process, covering top surfaces and sides of the first bulge portion 42e and the second bulge portion 42f. The hard mask layer 46 may comprise oxide, nitride or oxynitride. In one embodiment, the hard mask layer 46 may be nitride.

Figure 7:
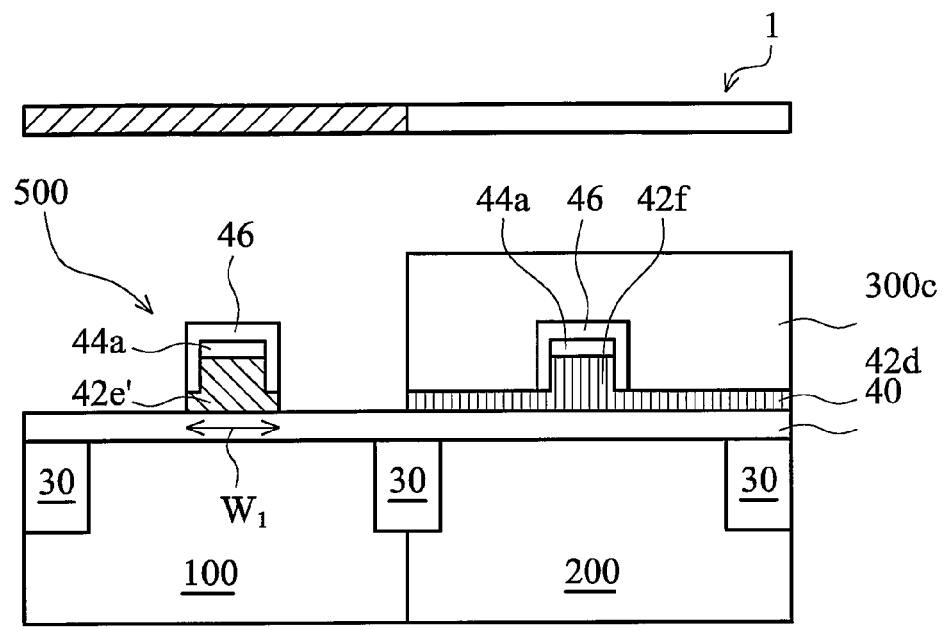
Figure 8:
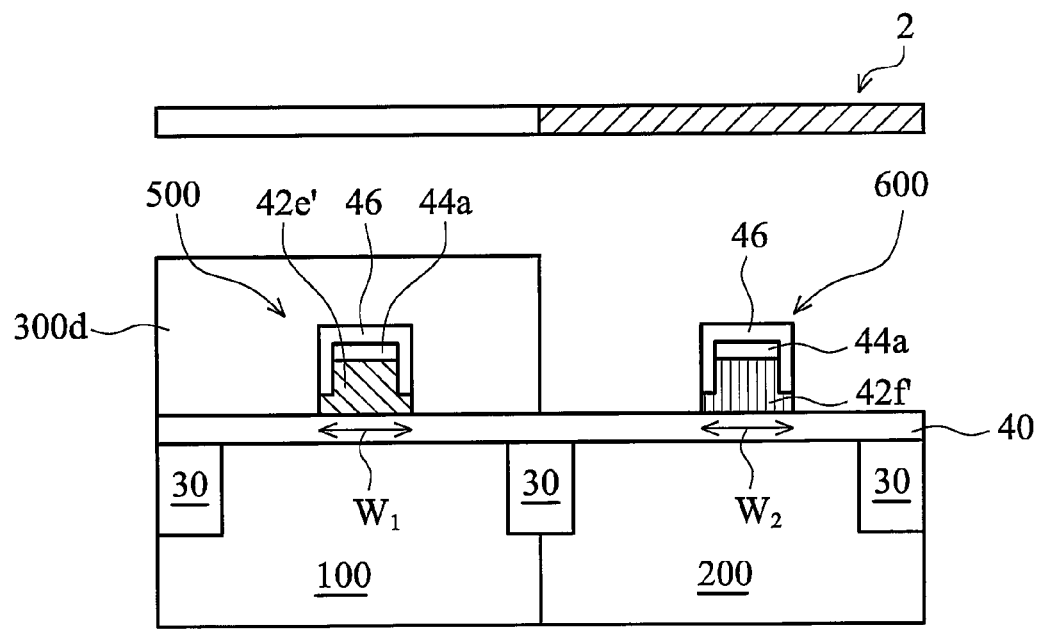
Figure 9:
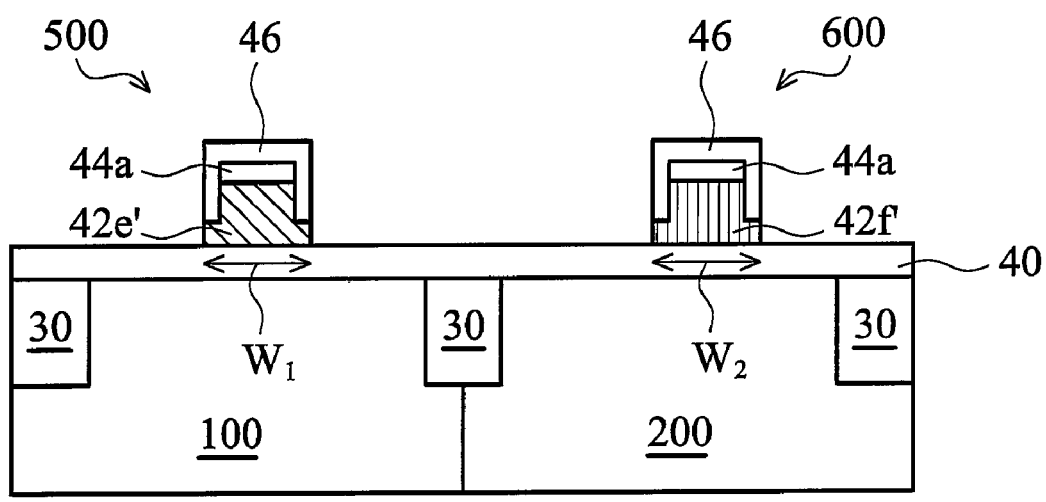

Referring to FIG. 7 to 9, after forming the hard mask layer 46, a first work function gate structure 500 having a first bottom width W1 and a second work function gate structure 600 having a second bottom width $W_2$ may be formed by performing a first etching process and a second etching process, respectively, to a portion of the patterned first work function electrode 42c and a portion of the patterned second work function electrode 42d to leave the first bulge portion 42e and the second bulge portion 42f under the hard mask layer 46. The first bottom width $W_1$ of the first bulge portion 42e may be equal to or smaller than the second bottom width $W_2$ of the second bulge portion 42f. Referring to FIG. 7, a sacrificial layer 300c may be formed on the second active region 200, covering the hard mask layer 46 and the patterned second work function electrode 42d, by a lithography process using the first mask 1 used for forming the sacrificial layer 300b. Using the hard mask layer 46 as a protective layer, the first work function gate structure 500 may be formed by performing the first etching process to the patterned first work function electrode 42c to leave the first bulge portion 42e under the hard mask layer 46. The first bulge portion 42e has the first bottom width $W_1$. The first bottom width $W_1$ may be equal to or smaller than a width of the hard mask layer 46. Therefore, the formed first work function gate structure 500 has the first bottom width $W_1$.

Referring to FIG. 8, after removing the sacrificial layer 300c, a sacrificial layer 300d may be formed on the first active region 100, covering the first work function gate structure 500, by a lithography process using the second mask 2 used for forming the sacrificial layer 300a. Using the hard mask layer 46 as a protective layer, the second work function gate structure 600 may be formed by performing the second etching process to a portion of the patterned second work function electrode 42d to leave the second bulge portion 42f under the hard mask layer 46. The second bulge portion 42f has the second bottom width $W_2$. The second bottom width $W_2$ may be equal to or smaller than a width of the hard mask layer 46. Therefore, the second work function gate structure 600 has the second bottom width $W_2$. The first etching process and the second etching process may be controlled according to the different etching rates of the patterned first work function electrode 42c and the patterned second work function electrode 42d, respectively, for forming the first bottom width $W_1$ and the second bottom width $W_2$ by changing etching methods or etching parameters, such as time, reactant composition or others.

Referring to FIG. 9, the sacrificial layer 300d is removed. The first work function gate structure 500 having the first bottom width $W_1$ and the second work function gate structure 600 having the second bottom width $W_2$ are thus formed.

The embodiments of the invention have several advantages, for example, a mask, such as the second mask, may be used for performing the second doping process to the electrode on the second active region to form the second work function electrode, and for performing the second etching process to a portion of the second work function electrode to form the second work function gate structure having the second bottom width. The other mask, such as the first mask, may be used for performing the first doping process to the electrode on the first active region to form the first work function electrode, and for performing the first etching process to a portion of the first work function electrode to form the first work function gate structure having the first bottom width. Thus, only one mask may be used for performing the doping process and the etching process to the electrode on the same active region without demand for other masks, and therefore costs can be reduced. The etching processes may be controlled according to different etching rates of the electrodes, and performed respectively, with less complexity, to precisely form the gate structures having desired bottom widths. Therefore, channel lengths and boundaries of source/drain electrodes may be precisely defined.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device, comprising:
   providing a substrate;
   defining a first active region and a second active region in the substrate;
   forming an electrode on the substrate, covering the first active region and the second active region;
   forming a first sacrificial layer on the second active layer and performing a first doping process to a portion of the electrode to form a first work function electrode on the first active layer;
   removing the first sacrificial layer and forming a second sacrificial layer on the first active layer, and performing a second doping process to a portion of the electrode to form a second work function electrode on the second active layer;
   removing the second sacrificial layer, and etching a portion of the first work function electrode and the second work function electrode to form a patterned first work function electrode with a first bulge portion and a patterned second work function electrode with a second bulge portion, wherein the patterned first and second work function electrodes further comprise flat portions over the first active region and the second active region of the substrate;

forming a hard mask layer, covering the first bulge portion and the second bulge portion and extending to cover the flat portions of the patterned first and second work function electrodes;

forming a third sacrificial layer on the second active region, covering the patterned second work function electrode;

removing a portion of the patterned first work function electrode to leave the first bulge portion under the hard mask layer to be a first work function gate structure using the third sacrificial layer covering the patterned second work function electrode as a first etching mask;

removing the third sacrificial layer and forming a fourth sacrificial layer on the first active region, covering the patterned first work function electrode;

removing a portion of the patterned second work function electrode to leave the second bulge portion under the hard mask layer to be a second work function gate structure using the fourth sacrificial layer covering the patterned first work function electrode as a second etching mask; and removing the fourth sacrificial layer.

2. The method for fabricating the semiconductor device as claimed in claim 1, wherein the first sacrificial layer, the second sacrificial layer, the third sacrificial layer, or the fourth sacrificial layer comprises oxide, nitride, or oxynitride.

3. The method for fabricating the semiconductor device as claimed in claim 1, wherein the first bulge portion of the first work function gate structure has a first bottom width, and the first bottom width is equal to or smaller than a width of the hard mask layer.

4. The method for fabricating the semiconductor device as claimed in claim 1, wherein the second bulge portion of the second work function gate structure has a second bottom width, and the second bottom width is equal to or smaller than a width of the hard mask layer.

5. The method for fabricating the semiconductor device as claimed in claim 1, further comprising:

patterning the first sacrificial layer on the second active region by using a first mask; and patterning the second sacrificial layer on the first active region by using a second mask.

6. The method for fabricating the semiconductor device as claimed in claim 5, further comprising patterning the third sacrificial layer on the second active region by using the first mask.

7. The method for fabricating the semiconductor device as claimed in claim 6, further comprising patterning the fourth sacrificial layer on the first active region by using the second mask.

8. The method for fabricating the semiconductor device as claimed in claim 1, further comprising forming a dielectric layer on the substrate, covering the first active region and second active region.

9. The method for fabricating the semiconductor device as claimed in claim 1, comprising forming a top electrode on the first bulge portion and the second bulge portion before forming the hard mask layer.

10. The method for fabricating the semiconductor device as claimed in claim 9, wherein the top electrode comprises metal.

11. The method for fabricating the semiconductor device as claimed in claim 10, wherein the metal comprises tungsten.

12. The method for fabricating the semiconductor device as claimed in claim 1, wherein the hard mask layer comprises silicon nitride.

13. The method for fabricating the semiconductor device as claimed in claim 1, wherein an etching rate of the first work function electrode is different from an etching rate of the second work function electrode.

14. The method for fabricating the semiconductor device as claimed in claim 1, wherein the electrode comprises polysilicon.

15. The method for fabricating the semiconductor device as claimed in claim 13, wherein the first work function electrode comprises N-type doped polysilicon.

16. The method for fabricating the semiconductor device as claimed in claim 15, wherein the second work function electrode comprises P-type doped polysilicon.

17. The method for fabricating the semiconductor device as claimed in claim 16, wherein the etching rate of the first work function electrode is faster than the etching rate of the second work function electrode.

18. A method for fabricating a semiconductor device, comprising:

providing a substrate;

defining a first active region and a second active region in the substrate;

forming an electrode on the substrate, covering the first active region and the second active region;

forming a first sacrificial layer on the second active layer by using a first mask and performing a first doping process to a portion of the electrode for forming a first work function electrode on the first active layer;

removing the first sacrificial layer and forming a second sacrificial layer on the first active layer by using a second mask, and performing a second doping process to a portion of the electrode for forming a second work function electrode on the second active layer;

removing the second sacrificial layer, and etching a portion of the first work function electrode and the second work function electrode for forming a patterned first work function electrode with a first bulge portion and a patterned second work function electrode with a second bulge portion, wherein the patterned first and second work function electrodes further comprise flat portions over the first active region and the second active region of the substrate;

forming a hard mask layer covering the first bulge portion and the second bulge portion and extending to cover the flat portions of the patterned first and second work function electrodes;

forming a third sacrificial layer on the second active region by using the first mask, covering the patterned second work function electrode;

removing a portion of the patterned first work function electrode to leave the first bulge portion under the hard mask layer to be a first work function gate structure using the third sacrificial layer covering the a portion of the patterned second work function electrode and the hard mask layer as a first etching mask;

removing the third sacrificial layer, and forming a fourth sacrificial layer on the first active region by using the second mask, covering the patterned first work function electrode;

removing a portion of the patterned second work function electrode to leave the second bulge portion under the hard mask layer to be a second work function gate structure using the fourth sacrificial layer covering the a portion of the patterned first work function electrode and the hard mask layer as a second etching mask; and removing the fourth sacrificial layer.

19. The method for fabricating the semiconductor device as claimed in claim 18, wherein the first bulge portion of the first work function gate structure has a first bottom width, and the first bottom width is equal to or smaller than a width of the hard mask layer.

20. The method for fabricating the semiconductor device as claimed in claim 18, wherein the second bulge portion of the second work function gate structure has a second bottom width, and the second bottom width is equal to or smaller than a width of the hard mask layer.

21. The method for fabricating the semiconductor device as claimed in claim 18, further comprising forming a top electrode on the first bulge portion and the second bulge portion before forming the hard mask layer.

22. The method for fabricating the semiconductor device as claimed in claim 21, wherein the top electrode comprises metal.

23. The method for fabricating the semiconductor device as claimed in claim 22, wherein the metal comprises tungsten.

24. The method for fabricating the semiconductor device as claimed in claim 18, wherein the hard mask layer comprises silicon nitride.

25. The method for fabricating the semiconductor device as claimed in claim 18, wherein an etching rate of the first work function electrode is different from an etching rate of the second work function electrode.

* * * * *